US012596143B2

(12) United States Patent
Moreira

(10) Patent No.: US 12,596,143 B2
(45) Date of Patent: Apr. 7, 2026

(54) OVER THE AIR (OTA) TESTING OF AN ANTENNA IN PACKAGE (AiP) DEVICE IN RADIATING NEAR FIELD USING A CHARACTERIZING DEVICE AND AUTOMATED TEST EQUIPMENT

(71) Applicant: Advantest Corporation, Tokyo (JP)

(72) Inventor: José Moreira, Stuttgart (DE)

(73) Assignee: Advantest Corporation, Tokyo (JP)

( * ) Notice: Subject to any disclaimer, the term of this patent is extended or adjusted under 35 U.S.C. 154(b) by 37 days.

(21) Appl. No.: 18/500,122

(22) Filed: Nov. 2, 2023

(65) Prior Publication Data

US 2024/0061030 A1    Feb. 22, 2024

Related U.S. Application Data

(63) Continuation of application No. PCT/EP2022/060128, filed on Apr. 14, 2022.

(51) Int. Cl.
*G01R 29/10* (2006.01)
*H04B 17/00* (2015.01)

(52) U.S. Cl.
CPC ......... *G01R 29/10* (2013.01); *H04B 17/0085* (2013.01)

(58) Field of Classification Search
CPC ................ G01R 29/10; G01R 31/2822; G01R 31/2884; G01R 31/31716;
(Continued)

(56) References Cited

U.S. PATENT DOCUMENTS 9,310,422 B2    4/2016  Nath et al.
10,031,160 B2    7/2018  Isaac et al.
(Continued)

FOREIGN PATENT DOCUMENTS

CN    108982977    12/2018
CN    111726176     9/2020
(Continued)

OTHER PUBLICATIONS

"TR-398 Wireless Test Systems," Frame Communications, retrieved from https://frame.co.uk/use-cases/anatomy-of-a-tr-398-wireless-test-system/, published 2020, pp. 1-4.

*Primary Examiner* — David E Lotter

(57) ABSTRACT

Embodiments according to the disclosure comprise an automated test equipment component, ATE component, e.g., a handler component, e.g., a handler arm, comprising a first antenna adapted to establish a wireless, e.g., near field, coupling with a device under test (DUT), e.g., comprising an antenna, e.g., comprising an antenna array, when the DUT is arranged on a loadboard, e.g., a DUT loadboard. Furthermore, the ATE component comprises a second antenna for establishing a wireless, e.g., near field, coupling with a characterizing device, e.g., a golden device, e.g., comprising an antenna, e.g., comprising an antenna array, when the characterizing device is arranged, e.g., placed, on the loadboard, wherein the DUT and the characterizing device are, for example, placed at different positions on the DUT loadboard. Moreover, the first antenna is electrically coupled, e.g., connected with a rigid electrical connection, with the second antenna, to allow for a forwarding of a signal, e.g., of a plurality of signals, provided, e.g., transmitted, by the DUT to the characterizing device, e.g., reference device, and/or vice versa, e.g., to allow for a forwarding of a signal, e.g., of a plurality of signals, provided, e.g., transmitted, by the characterizing device to the DUT. Optionally, a relative position of the second antenna with respect to the first antenna may be fixed, or for example, a relative position of the second antenna with respect to the first antenna may be variable.

23 Claims, 10 Drawing Sheets

(58) Field of Classification Search
    CPC .............. G01R 31/31905; G01R 1/045; G01R
                29/0878; G01R 29/0835; G01R 29/0871;
                                            H04B 17/0085
    See application file for complete search history.

(56)                References Cited

U.S. PATENT DOCUMENTS

| | | | |
|---|---|---|---|
| 10,852,349 B2 | 12/2020 | Liu et al. | |
| 10,890,610 B2 | 1/2021 | Gondi et al. | |
| 2009/0115440 A1 | 5/2009 | Bergmann | |
| 2009/0184719 A1 | 7/2009 | Ko et al. | |
| 2011/0267086 A1* | 11/2011 | Pagani | G01R 31/2884 |
| | | | 324/754.21 |
| 2015/0048980 A1* | 2/2015 | Chin | G01R 31/2822 |
| | | | 343/703 |
| 2015/0168486 A1* | 6/2015 | Isaac | G01R 31/2822 |
| | | | 324/756.02 |

| | | | |
|---|---|---|---|
| 2019/0187200 A1* | 6/2019 | Gondi | H04B 17/15 |
| 2020/0313268 A1 | 10/2020 | Chang et al. | |
| 2021/0033668 A1* | 2/2021 | Trotta | H04B 17/17 |
| 2021/0194601 A1 | 6/2021 | Shiota et al. | |

FOREIGN PATENT DOCUMENTS

| | | |
|---|---|---|
| CN | 112311479 A | 2/2021 |
| CN | 112415283 | 2/2021 |
| JP | H03-39914 | 4/1991 |
| JP | 2004-525546 A | 8/2004 |
| JP | 2009-529125 A | 9/2007 |
| JP | 2014-96742 A | 5/2014 |
| JP | 2019-101016 A | 6/2019 |
| JP | 2020-145603 A | 9/2020 |
| JP | 2021-101166 A | 7/2021 |
| TW | 202125994 A | 7/2021 |

* cited by examiner

900

Establishing, with a first antenna,
a wireless coupling with a DUT,          910

Establishing, with a second antenna,
a wireless coupling with a characterizing device          920

Forwarding a signal provided by the DUT
to the characterizing device, and/or vice versa          930

OVER THE AIR (OTA) TESTING OF AN ANTENNA IN PACKAGE (AiP) DEVICE IN RADIATING NEAR FIELD USING A CHARACTERIZING DEVICE AND AUTOMATED TEST EQUIPMENT

CROSS-REFERENCE TO RELATED APPLICATION

This application is a Continuation of copending International Application No. PCT/EP2022/060128, filed on Apr. 14, 2022, which is incorporated herein by reference in its entirety.

TECHNICAL FIELD

Embodiments according to the disclosure are related to automated test equipment components, automated test equipment and methods for establishing a coupling with a device under test (DUT) and with a characterizing device using first and second antennas.

Furthermore, embodiments according to the disclosure are related to over-the-air (OTA) testing, e.g., 5G OTA testing, with golden devices.

BACKGROUND

When using loopback for OTA testing, e.g., for an antenna in package (AiP) module, the parasitic coupling that there is between the different antenna elements on the AiP module or the non-ideal isolation between polarizations of each AiP antenna element are used. However, it is never a good situation to use parasitic effects for testing.

Also, for loopback OTA testing, the DUT requires special design for testing (DFT) that enables transmitting and receiving simultaneously by different antenna elements on the AiP module. This may not be a mode that is required for normal operation and may require time and silicon space for implementation. Furthermore, this might also have impact on the DUT performance.

SUMMARY

Therefore, it is desired to get a concept which makes a better compromise between silicon space and performance impact on a device to enable its testing, as well as for complexity, accuracy and costs for the device and testing thereof.

Embodiments according to the disclosure comprise an automated test equipment component (ATE component), e.g., a handler component, e.g., a handler arm, comprising a first antenna, e.g., a measurement antenna, adapted to establish a wireless, e.g., near field, coupling with a device under test (DUT), e.g., comprising an antenna, e.g., comprising an antenna array, when the DUT is arranged on a loadboard, e.g., a DUT loadboard. Furthermore, the ATE component comprises a second antenna, e.g., a measurement antenna, for establishing a wireless, e.g., near field, coupling with a characterizing device, e.g., a golden device, e.g., comprising an antenna, e.g., comprising an antenna array, when the characterizing device is arranged, e.g., placed, on the loadboard, wherein the DUT and the characterizing device are, for example, placed at different positions of the DUT loadboard. Moreover, the first antenna is electrically coupled, e.g., connected with a rigid electrical connection, with the second antenna, to allow for a forwarding of a signal, e.g., of a plurality of signals, provided, e.g., transmitted, by the DUT to the characterizing device, and/or vice versa, e.g., to allow for a forwarding of a signal, e.g., of a plurality of signals, provided, e.g., transmitted, by the characterizing device to the DUT. Optionally, a relative position of the second antenna with respect to the first antenna may be fixed, or for example, a relative position of the second antenna with respect to the first antenna may be variable.

Embodiments according to the disclosure are based on the idea to use a characterizing device, e.g., a golden device, for the testing of a device under test (DUT). The characterizing device may hence be a well calibrated device, e.g., a device tested and calibrated with high accuracy. As an example, the characterizing device may be a reference device.

The characterizing device, e.g., a golden device, may, for example, be previously tested in a thorough characterization environment (e.g., far field). Also, the characterizing device may, for example, be of a different model or even with a different antenna array than the DUT, e.g., as long as it works on the same frequency range at the DUT test program.

As an example, the characterizing device may replace, e.g., in view of conventional approaches, expensive dedicated measurement devices, e.g., expensive millimeter-wave (mmWave) instrumentation. As an example, an expensive measurement device may be used for calibrating several characterizing devices, wherein the characterizing devices may each be used subsequently for testing a plurality of DUTs, instead of requiring a plurality of expensive measurement devices for testing the DUTs.

However, embodiments according to the disclosure are not limited to thoroughly tested and calibrated characterizing devices, e.g., in the sense of a golden device. As an example, a second uncalibrated DUT may as well be used as characterizing devices, for testing a first DUT. Each of the two DUTs may, for example, act as a characterizing device for the other device.

Furthermore, the inventor recognized that, using a characterizing device and the first and second antenna for coupling the characterizing device and a DUT, testing may be performed efficiently and, for example, without suffering some of the disadvantages of loopback testing.

In other words, the cost of test may be lowered by not using expensive mmWave instrumentation and in addition some of the drawbacks of the OTA testing using loopback may be avoided.

The first antenna may provide a connection the DUT and the second antenna may provide a connection to the characterizing device, wherein first and second antenna are electrically coupled with each other. Hence, the ATE component comprising the first and second antenna may act as a connecting or coupling component between DUT and characterizing device.

Using a wireless link between ATE component and DUT/characterizing device, the DUT and/or the characterizing device may be swapped or exchanged easily. As an example, the ATE component may be movable, in order to quickly exchange a tested DUT for an untested DUT on the loadboard. The characterizing device may remain on the loadboard or may be exchanged as well. Thus, a good testing flexibility may be provided.

Furthermore, devices under test do not necessarily need additional test-specific functionality in order to be tested. Thus, silicon space, design effort, and hence costs may be reduced, as well as not suffering performance reduction because of additional test-specific circuitry.

According to further embodiments of the disclosure, the first antenna is configured to provide and/or to receive a signal, e.g., a plurality of signals, comprising a predetermined frequency, e.g., a signal within a predetermined frequency range, wherein the signal is received and/or provided by the DUT. Furthermore, the second antenna is configured to receive and/or to provide the signal, e.g., a plurality of signals, comprising the predetermined frequency, e.g., a signal within a predetermined frequency range, wherein the signal is provided and/or received by the characterizing device. Moreover, the first antenna may be an antenna having similar characteristics, e.g., the same characteristics, e.g., comprising an identical antenna design, e.g., being the same kind of antenna or being the same antenna, as the second antenna, or the first antenna may be an antenna having different characteristics, e.g., being based on a different antenna design, e.g., being a different antenna, relative to the second antenna.

Embodiments are not limited to specific, equal antenna designs of the first and second antenna. As an example, as long as the first and second antenna are configured to provide or to respectively receive signals within a frequency band of the DUT and the characterizing device, the DUT may be tested efficiently. This may allow to further reduce costs, since one ATE component having a pair of antenna elements may be used for a plurality of different DUTs. Vice versa an inventive ATE component may be equipped with different antennas, not being limited to specific antenna pairings.

According to further embodiments of the disclosure, the ATE component is configured to allow for a usage of the characterizing device for an evaluation of a signal, e.g., of a test signal, provided, e.g., transmitted, by the DUT. Alternatively or in addition, the ATE component is configured to allow for a usage of the DUT for a processing of a signal, e.g., of a test signal, provided, e.g., transmitted, by the characterizing device, e.g., in order to evaluate the processing of the signal, for example, to test the DUT.

As explained before, the ATE component may be a connection module, or a coupling module configured to connect or to couple the DUT and the characterizing device, in order to forward a signal from the one to the other. This way, a signal provided or produced by the DUT may, for example, be evaluated by the characterizing device in order to test the DUT. Vice versa, a processing result provided by the DUT may, for example, be evaluated, based on an accurately known signal provided by the characterizing device, forwarded to the DUT via the ATE component. Hence, signal providing capabilities, signal receiving capabilities and signal processing capabilities of the DUT may be tested.

According to further embodiments of the disclosure, the ATE component comprises circuitry and the circuitry is configured to allow for a directing of the signal provided, e.g., transmitted, by the DUT to the characterizing device. Alternatively or in addition, the circuitry may be configured to allow for a directing of the signal provided, e.g., transmitted, by the characterizing device to the DUT. Alternatively or in addition, the circuitry may be configured to allow for a manipulation, e.g., improvement; e.g., adaptation; e.g., processing; e.g., reinforcing; e.g., attenuation; e.g., combining of signals; e.g., a conversion from a balanced signal to an unbalanced signal and/or vice versa, of the signal provided, e.g., transmitted, by the characterizing device to the DUT. Alternatively or in addition, the circuitry may be configured to allow for a manipulation, e.g., improvement; e.g., adaptation; e.g., processing; e.g., reinforcing; e.g., attenuation; e.g., combining of signals; e.g., a conversion from a balanced signal to an unbalanced signal and/or vice versa, of the signal provided, e.g., transmitted, by the DUT to the characterizing device.

As an example, the ATE component may be configured to couple the characterizing device with a plurality of DUTs, e.g., via a plurality of first antennas. Hence, testing may be performed iteratively, such that the circuitry may direct a signal of a respective DUT to be tested to the characterizing device. Vice versa a test signal provided by the characterizing device may be directed to a respective DUT of a plurality of DUTs.

Furthermore, the circuitry may be configured to allow for a manipulation of the signal forwarded by the ATE component. As an example, the signal may be attenuated to simulate a longer distance between DUT and characterizing device. It should be noted that embodiments according to the disclosure are not limited to a specific type of signal manipulation; the signal may be manipulated or directed in any way suitable for providing good DUT testing results or for simulating a specific use case or environment.

According to further embodiments of the disclosure, the ATE component comprises circuitry and the circuitry comprises at least one of an attenuator, a balun, a switch, a diplexer, and/or a combiner, e.g., in a signal path between the first antenna and the second antenna.

According to further embodiments of the disclosure, the ATE component comprises a device pusher, and the device pusher is configured to push the DUT and/or the characterizing device towards the loadboard, e.g., to apply a force on the DUT and/or the characterizing device, e.g., in order to couple, e.g., electrically, the DUT and/or the characterizing device with the loadboard, e.g., with and/or using a socket of the loadboard, e.g., with and/or using an electrical contact of the loadboard.

The inventor recognized that using a device pusher, testing may be performed more efficiently. The ATE component may be configured to address multiple DUTs on the loadboard in parallel or iteratively, hence being optionally configured to apply a force for coupling one or more DUTs. As an example, the ATE component may be actuated to move above the loadboard in order to couple a respective DUT to be tested with the loadboard by applying pressure and to couple the pressed DUT with the characterizing device via the first and second antenna, e.g., before moving on to another DUT in order to couple it with loadboard and the characterizing device.

According to further embodiments of the disclosure, the ATE component comprises a shielding and the shielding may be configured to reduce electromagnetic disturbances on the signal provided, e.g., transmitted, by the DUT to the characterizing device and/or to reduce electromagnetic disturbances on the signal provided, e.g., transmitted, by the characterizing device to the DUT. Alternatively or in addition, the shielding may be configured to reduce electromagnetic disturbances in a surrounding of the ATE component caused by the signal provided, e.g., transmitted, by the DUT to the characterizing device, and/or by the signal provided, e.g., transmitted, by the characterizing device to the DUT.

The inventor recognized that using a shielding, accuracy and robustness of device testing may be improved. The shielding may, for example, be part of the device pusher, or may be a separate element of the ATE component.

As an example, the shielding may not or even cannot be used to push the DUT towards the loadboard (i.e., electrical contacts on the socket in the loadboard) because the shielding material may detune the DUT. A material with a low dielectric constant may be used or may have to be used to push the DUT so that it does not detune the DUT (e.g., low dielectric constant means as close to air as possible). As an example, the shielding material may be used in the areas surrounding the DUT/measurement antenna/characterizing device and not in the regions where a wireless signal propagates to/from the DUT/measurement antenna/characterizing device.

Hence, according to embodiments a device pusher, separate from the shielding, may be used, wherein the device pusher is configured to apply pressure to one or more DUTs whilst not detuning the same. The device pusher may be configured not to detune the DUT when applying pressure. Therefore, the device pusher may comprise a material with a low dielectric constant in order to push the DUT (e.g., low dielectric constant means as close to air as possible).

Furthermore, the shielding may protect a surrounding of the DUT and characterizing device from the electromagnetic disturbances from the signals provided from DUT to characterizing device or vice versa. As an example, on a loadboard, a plurality of DUTs may be arranged and tested. As an example, at one time, one of the DUTs may be coupled with the characterizing device in order to perform OTA testing. Hence, it may be advantageous to protect the other devices on the loadboard from influences of this test, e.g., in order to be tested in a different manner.

Similarly, a testing signal from DUT to characterizing device or vice versa may be shielded or protected from outside disturbances, such as other tests.

According to further embodiments of the disclosure, the ATE component is configured to sequentially couple the characterizing device with a plurality of respective DUTs, and/or the ATE component is configured to simultaneously, e.g., in parallel, couple the characterizing device with a plurality of respective DUTs, e.g., wherein the ATE component is configured to couple, iteratively and/or parallelly, the characterizing device with a respective DUT of a plurality of DUTs, when the respective DUT is arranged on the loadboard.

Therefore, as an example, the ATE component may comprise a plurality of first antennas, e.g., in order to couple the characterizing device with multiple DUTs, wherein, as an example, each DUT may be coupled via a separate first antenna of the plurality of first antennas via the second antenna to the characterizing device. Hence, a coupling may be performed in parallel, e.g., such that all DUTs are coupled with the characterizing device at the same time, or iteratively, e.g., such that one of the DUTs is coupled with the characterizing device at a time. As an example, the ATE component may comprise circuitry, that may be configured to couple or to uncouple a signal path between the second antenna of the characterizing device and a respective first antenna coupled with a DUT.

Alternatively, the ATE component may comprise exactly one first and exactly one second antenna, and the ATE component may be configured to be moved, such that the first antenna is arranged iteratively in coupling range to one after another of a plurality of DUTs, in order to test the same iteratively. The second antenna may, for example, remain above the characterizing device in this case.

Hence, either way, testing may be performed fast and with high flexibility.

According to further embodiments of the disclosure, the ATE component is configured to allow for a testing of the DUT using a normal operation mode of the DUT, e.g., an operation mode that is not test-specific or not test-exclusive; e.g., an operation mode that is designed for an application specific functionality. Alternatively or in addition, the ATE component may be configured to allow for a testing of the characterizing device using a normal operation mode of the characterizing device, e.g., an operation mode that is not test-specific or not test-exclusive; e.g., an operation mode that is designed for an application specific functionality.

Hence, using the inventive ATE component, no additional silicon space may have to be used in order to provide test specific functionality. This may reduce development durations of new devices as well as costs.

Furthermore, a test quality may be improved. By testing functionality that will be performed in a normal operation mode, operation of the device in the final application can be simulated and hence behavior and quality of the device may be tested with more significance than in case test-specific functionality is run.

Further embodiments according to the disclosure comprise an automated test equipment (ATE) comprising a handler, e.g., a handler comprising a pusher, e.g., a handler pusher, the handler comprising an ATE component as explained before and the loadboard, e.g., a DUT loadboard, wherein the ATE is configured to test the DUT using the ATE component.

The inventor recognized that a combination of the functionality of a handler and the inventive ATE component in an ATE with a loadboard may provide synergistic advantages. Hence, the handler may optionally comprise the ATE component. This way, the handler may be configured to move and/or to arrange the ATE component over respective DUTs and/or the characterizing device on the loadboard. The handler may hence actuate the ATE component and may provide control signals for optional circuitry of the ATE component in order to manipulate the signal forwarded. Consequently, switching and moving of DUTs as well as changing measurement modes may be performed efficiently.

According to further embodiments of the disclosure, the ATE is configured to configure the DUT and the characterizing device as corresponding, or, for example, communicating, transmission and receiving devices and the ATE is configured to evaluate the DUT on the basis of a reception of a signal by the characterizing device from the DUT via the ATE component and/or on the basis of a reception of a signal by the DUT from the characterizing device via the ATE component.

Hence, the ATE may be configured to match DUT and characterizing device to each other with respect to signal provision and signal reception. This may allow a good flexibility for testing, since this way, different couples of devices may be configured as transmitting and/or receiving device. Furthermore, the ATE may be configured to easily cause a switching of roles with respect to transmission/reception between DUT and characterizing device.

According to further embodiments of the disclosure, the ATE is configured to set a distance between the ATE component and the DUT, and, for example, the characterizing device, to a first distance, in order to exchange, e.g., replace, the DUT on the loadboard and the ATE is configured to set a distance between the ATE component and the DUT, and, for example, the characterizing device, to a second distance, in order to wirelessly couple the first antenna with the DUT.

As an example, the ATE may comprise two operating modes, one for exchanging a DUT, wherein the ATE component is moved further away from a DUT to be exchanged, and a second operating mode for testing the DUT, wherein the ATE component is positioned in close proximity to the DUT to be tested with the first antenna and with close proximity to the characterizing device with the second antenna. Hence, testing may be performed quickly and efficiently and with increased space between ATE component and DUT, DUT exchange may be performed safely. The handler of the ATE may, for example, provide an actuation for the changing of the distance.

According to further embodiments of the disclosure, the loadboard comprises a DUT position, e.g., a socket on the loadboard; e.g., an area comprising pogo pins, e.g., an area comprising needles, e.g., for electrically coupling the DUT to the loadboard. Optionally, the DUT may be arranged on the DUT position, when the DUT is coupled wirelessly with the first antenna. Furthermore, the ATE may be configured to position the ATE component, such that the first antenna is placed vertically, with respect to a surface of the loadboard that is facing the ATE component, above the DUT position, e.g., with the second distance, such that the first antenna is facing the DUT position.

Alternatively or in addition, the loadboard comprises a characterizing device position, e.g., a socket on the loadboard; e.g., an area comprising pogo pins, e.g., an area comprising needles, e.g., for electrically coupling the characterizing device to the loadboard. Optionally, the characterizing device may be arranged on the characterizing device position, when the characterizing device is coupled wirelessly with the second antenna. Moreover, the ATE may be configured to position the ATE component, such that the second antenna is placed vertically, with respect to the surface of the loadboard that is facing the ATE component, above the characterizing device position, e.g., with the second distance, such that the second antenna is facing the characterizing device position.

Hence, as an example, in a second operating mode, the handler may move or arrange the antennas of the ATE component vertically above the DUT and the characterizing device respectively. This arrangement may allow a good coupling between DUT and first antenna and characterizing device and second antenna.

According to further embodiments of the disclosure, the ATE component comprises a shielding; and the shielding is configured to enclose a volume at least partially in a radiation direction of the first antenna. Furthermore, the shielding is configured to provide a substantially electromagnetically shielded transmission path between the DUT and the first antenna, when the first antenna is coupled wirelessly with the DUT, e.g., when the distance between the ATE component and the DUT is set to the second distance and/or when the first antenna is placed vertically, with respect to the surface of the loadboard that is facing the ATE component, above the DUT position.

Alternatively or in addition, the shielding is configured to enclose a volume at least partially in a radiation direction of the second antenna and the shielding is configured to provide a substantially electromagnetically shielded transmission path between the characterizing device and the second antenna, when the second antenna is wirelessly coupled with the characterizing device, e.g., when the distance between the ATE component and the characterizing device is set to the second distance and/or when the second antenna is placed vertically, with respect to the surface of the loadboard that is facing the ATE component, above the characterizing device position.

Hence, the shielding may be configured to shield the transmission path when the ATE component is in a testing distance of the loadboard and respectively the DUT and the characterizing device. This may allow to increase the quality of a signal exchanged in between DUT and characteristic device and hence the testing quality.

Further embodiments according to the disclosure comprise a method for testing a device under test (DUT), the method comprising establishing, with a first antenna, a wireless, e.g., near field, coupling with a DUT, when the DUT is arranged on a loadboard, e.g., a DUT loadboard, and establishing, with a second antenna, a wireless, e.g., near field, coupling with a characterizing device, e.g., a golden device, when the characterizing device is arranged, e.g., placed, on the loadboard. Moreover, the first antenna is electrically coupled with the second antenna and the method further comprises forwarding a signal provided, e.g., transmitted, by the DUT to the characterizing device, and/or vice versa.

The method as described above is based on the same considerations as the above-described ATE component and ATE. The method can, by the way, be completed with all features and functionalities, which are also described with regard to the ATE component and/or ATE.

According to further embodiments of the disclosure, the wireless, e.g., near field, coupling with the DUT is established with the first antenna of an ATE component as explained above and the wireless, e.g., near field, coupling with the characterizing device is established with the second antenna of the ATE component and the signal is forwarded using the ATE component.

According to further embodiments of the disclosure, the characterizing device is at least one of a calibrated device, e.g., a device being previously tested in a thorough characterization environment, e.g., far field, an uncalibrated device, a device having similar characteristics, e.g., the same characteristics, e.g., comprising an identical device design, e.g., being the same kind of device or being the same device, as the DUT, and/or a device having different characteristics, e.g., being based on a different device design, e.g., comprising a different antenna, relative to the DUT.

As explained above, using the inventive ATE component a plurality of device pairing may be used in order to test a DUT. Hence, a high testing flexibility may be provided.

According to further embodiments of the disclosure, the characterizing device is soldered to the loadboard and the DUT is removably attached to the loadboard. Hence, the DUT may be replaced easily after testing, such that a new untested DUT may be coupled with the characterizing device. On the other hand, the characterizing device may be used for testing many DUTs. Consequently, a solid connection to the loadboard may reduce wear of contact areas of the characterizing device.

According to further embodiments of the disclosure, the DUT is an antenna in package device (AiP) device. The inventor recognized that the inventive ATE component may allow an especially advantageous testing of AiP devices.

Embodiments according to the disclosure comprise an approach for over the air (OTA) testing of an antenna in package (AiP) device in the radiating near field using a golden device. The near field region is generally divided into a reactive near field region very close to the antenna and a radiating near field region between the reactive near field region and a far field region sufficiently distant from the antenna to assume free space and plane waves.

The radiating near field region is also called the Fresnel region and is bounded by the Fraunhofer distance from the antenna.

Embodiments are disclosed by the subject matter of the independent claims of the present application.

Further embodiments according to the disclosure are defined by the subject matter of the dependent claims of the present application.

This summary is provided to introduce a selection of principles of the disclosure in a simplified form that are further described below in the Detailed Description section. This summary is not intended to identify key features or essential features of the claimed subject matter, nor is it intended to be used to limit the scope of the claimed subject matter.

BRIEF DESCRIPTION OF THE DRAWINGS

The accompanying drawings, which are incorporated in and form a part of this specification, illustrate embodiments, together with the description, serve to explain the principles of the disclosure.

The drawings are not necessarily to scale, emphasis instead generally being placed upon illustrating the principles of the disclosure. In the following description, various embodiments of the disclosure are described with reference to the following drawings.

DETAILED DESCRIPTION

Figure 1:
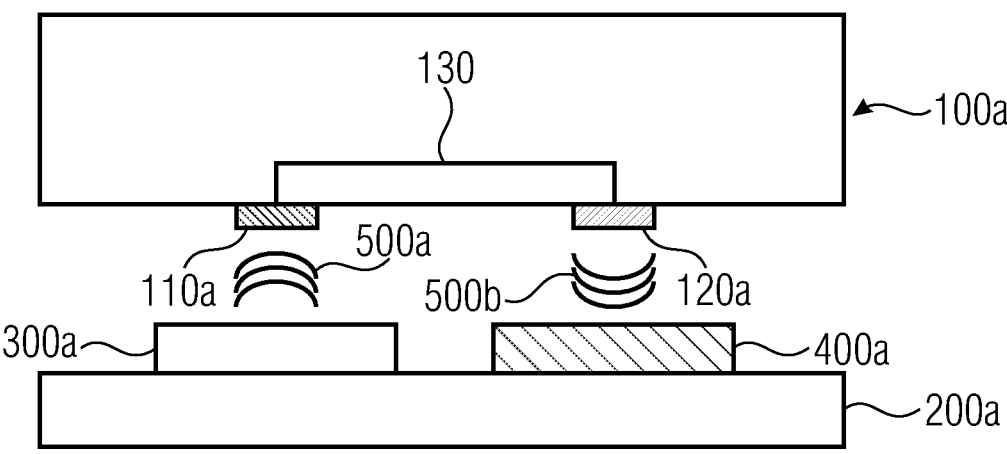
FIG. 1 shows a schematic side view of an ATE component according to embodiments of the disclosure.

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications, and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described herein after may be combined with each other, unless specifically noted otherwise.

FIG. 1 shows a schematic side view of an ATE component according to embodiments of the disclosure. FIG. 1 shows ATE component 100a, comprising a first antenna 110a and a second antenna 120a, wherein the first and second antennas are electrically coupled with each other. As an optional example, in FIG. 1 the first and second antennas are coupled with a rigid electrical connection 130, e.g., a cable, e.g., an rf-cable. The electrical coupling may allow a forwarding of signals from one antenna to the other.

In addition to the ATE component 100a, a loadboard 200a and, arranged on the loadboard 200a, a DUT 300a and a characterizing device 400a are shown.

The first antenna 110a is configured to receive a wireless signal 500a from the DUT 300a. The DUT 300a may comprise an antenna, an antenna array, and/or a combination thereof in order to provide the wireless signal to the antenna 110a. The signal may then be forwarded to the second antenna 120a, e.g., using connection 130, in order to be provided to the characterizing device 400a. Hence, antenna 120a may be configured to transmit the forwarded signal 500b. Accordingly characterizing device 400a may comprise an antenna, an antenna array, and/or a combination thereof in order to receive the wireless signal from the antenna 120a. Signal 500a and 500b may, for example, be equal, but signal 500b may as well be alienated because of signal losses, disturbances or signal manipulation.

Optionally, the relative position between antenna 110a and antenna 120a may be variable. As an example, in case the ATE component 100a is configured to iteratively couple a DUT of a plurality of DUTs arranged on a loadboard to one characterizing device arranged on the same loadboard, distances between a respective DUT and the characterizing device may vary, hence, optionally ATE component 100a may be configured to adjust a distance between antenna 110a and antenna 120a.

It is to be noted that accordingly, characterizing device 400a may provide a signal 500a that is forwarded using the ATE component 100a to the DUT 300a (e.g., swapping signals 500a and 500b in FIG. 1).

Optionally, the first and second antenna may be adapted in order to provide and/or to receive signals within a predetermined frequency band. In order to receive a signal with one of the antennas and to forward it with the other antenna, according to embodiments, the antennas may be configured to address signals within a common frequency band or frequency range. However, antenna 110a and antenna 120a do not necessarily have to be identical. Embodiments according to the disclosure are not limited to identical or even similar antennas, apart from the possible signal frequencies.

Hence, optionally, first and second antenna may have similar or identical characteristics, e.g., an identical antenna design, e.g., being the same kind of antenna or being the same antenna, or alternatively, first and second antenna may have different characteristics, e.g., being based on a different antenna designs, e.g., being different antennas. Hence, using the inventive ATE component 100a, testing may be performed with good flexibility. Antennas may be exchanged easily, for example, without being forced to replace a broken antenna with an identical replacement.

As another optional feature, using the ATE component 100a, the characterizing device 400a may evaluate the signal 500a provided by the DUT 300a. Vice versa, using the ATE component 100a, the DUT 300a may process a signal provided by the characterizing device 400a. In other words, the ATE component 100a may allow a processing or an evaluation of a wireless signal provided by one device to the other device.

As another optional feature, ATE component 100a may be configured to allow for a testing of the DUT 300a using a normal operation mode of the DUT. Hence, no test specific circuitry of the DUT may be used or necessary for its testing.

Figure 2:
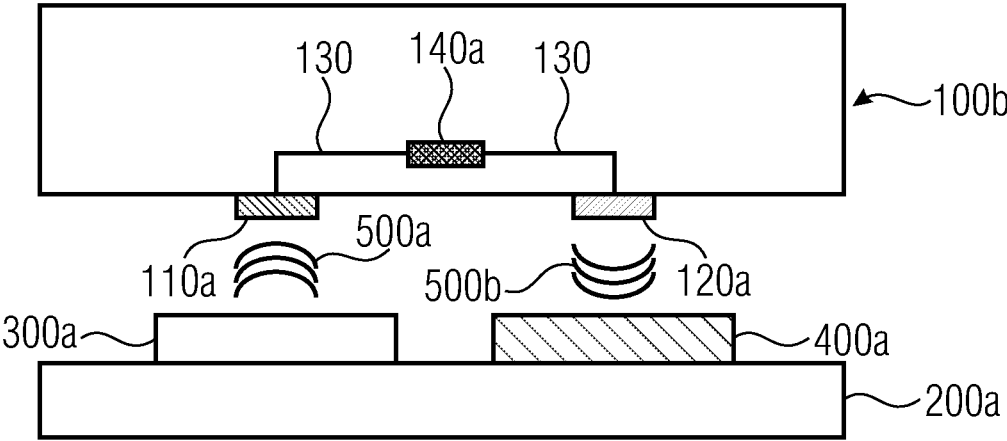
FIG. 2 shows a schematic side view of an ATE component with optional circuitry according to embodiments of the disclosure.

FIG. 2 shows a schematic side view of an ATE component with optional circuitry according to embodiments of the disclosure. FIG. 2 shows ATE component 100b, comprising, in addition to the elements as explained in the context of FIG. 1, circuitry 140a. As optionally shown in FIG. 2 circuitry 140a may be arranged between the first and second antenna.

As an example, the circuitry 140a may be configured to direct the signal provided 500a by the DUT 300a to the characterizing device 400a, and/or vice versa. As another example, ATE component 100b may comprise a plurality of first antennas, coupled with a plurality of DUTs arranged on the loadboard 200a. For example, for an iterative testing, circuitry 140a may select one signal from one DUT to be forwarded to the characterizing device 400a to be evaluated before selecting and forwarding a signal from another DUT.

Furthermore, in addition or alternatively to the directing of signals, circuitry 140a may be configured to manipulate the signal provided by the DUT 300a to the characterizing device 400a or vice versa. The circuitry 140a may, for example, be configured to improve, to adapt, to process, to reinforce, and/or to attenuate the signal.

As another optional feature, e.g., as in a case wherein ATE component 100b comprises a plurality of first antennas, the circuitry 140a may be configured to combine signals, e.g., of different DUTs. Apart from this, circuitry 140a may be configured to combine signal 500a with a signal that may not be provided by another DUT, e.g., a simulated signal, e.g., in order to simulate a disturbance.

As another optional feature, e.g., in order to provide any of the above explained functionality, circuitry 140a may comprise at least one of an attenuator, a balun, a switch, a diplexer, and/or a combiner, e.g., as shown in FIG. 1 in a signal path between the first antenna 110a and the second antenna 120a.

Figure 3:
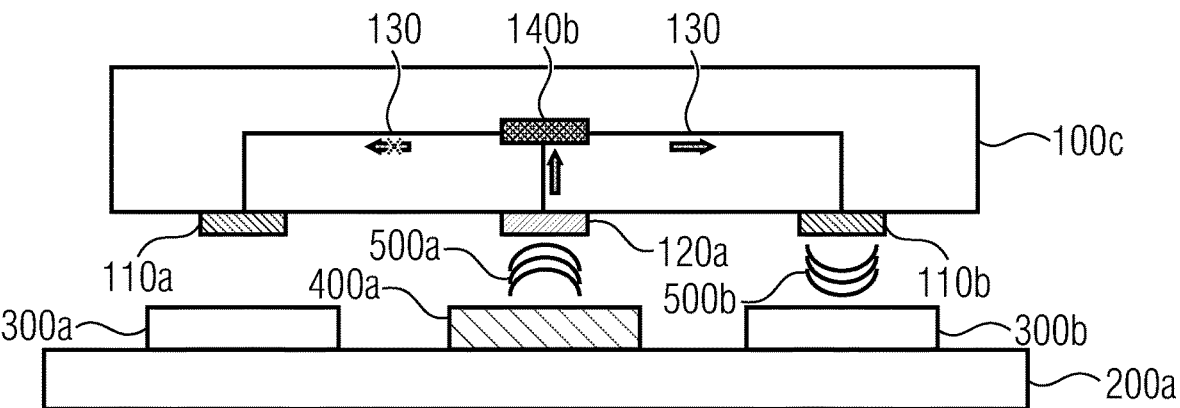
FIG. 3 shows a schematic side view of an ATE component with optional circuitry for directing a signal according to embodiments of the disclosure.

FIG. 3 shows a schematic side view of an ATE component with optional circuitry for directing a signal according to embodiments of the disclosure. FIG. 3 shows, in addition to the elements as explained in the context of FIG. 1 and FIG. 2, an ATE component 100c comprising circuitry 140b. Furthermore, ATE component 100c comprises a plurality of first antennas, namely antennas 110a and 110b. On the loadboard 200a, a further DUT 300b is arranged. The further antenna 110b may allow a wireless coupling with the DUT 300b. As shown in FIG. 3, a signal 500a provided by the characterizing device 400a may be directed by the circuitry 140b to the further DUT 300b exclusively, e.g., as a signal 500b that may be equal to signal 500a or that may be additionally manipulated by circuitry 140b, via antenna 110b.

Figure 4:
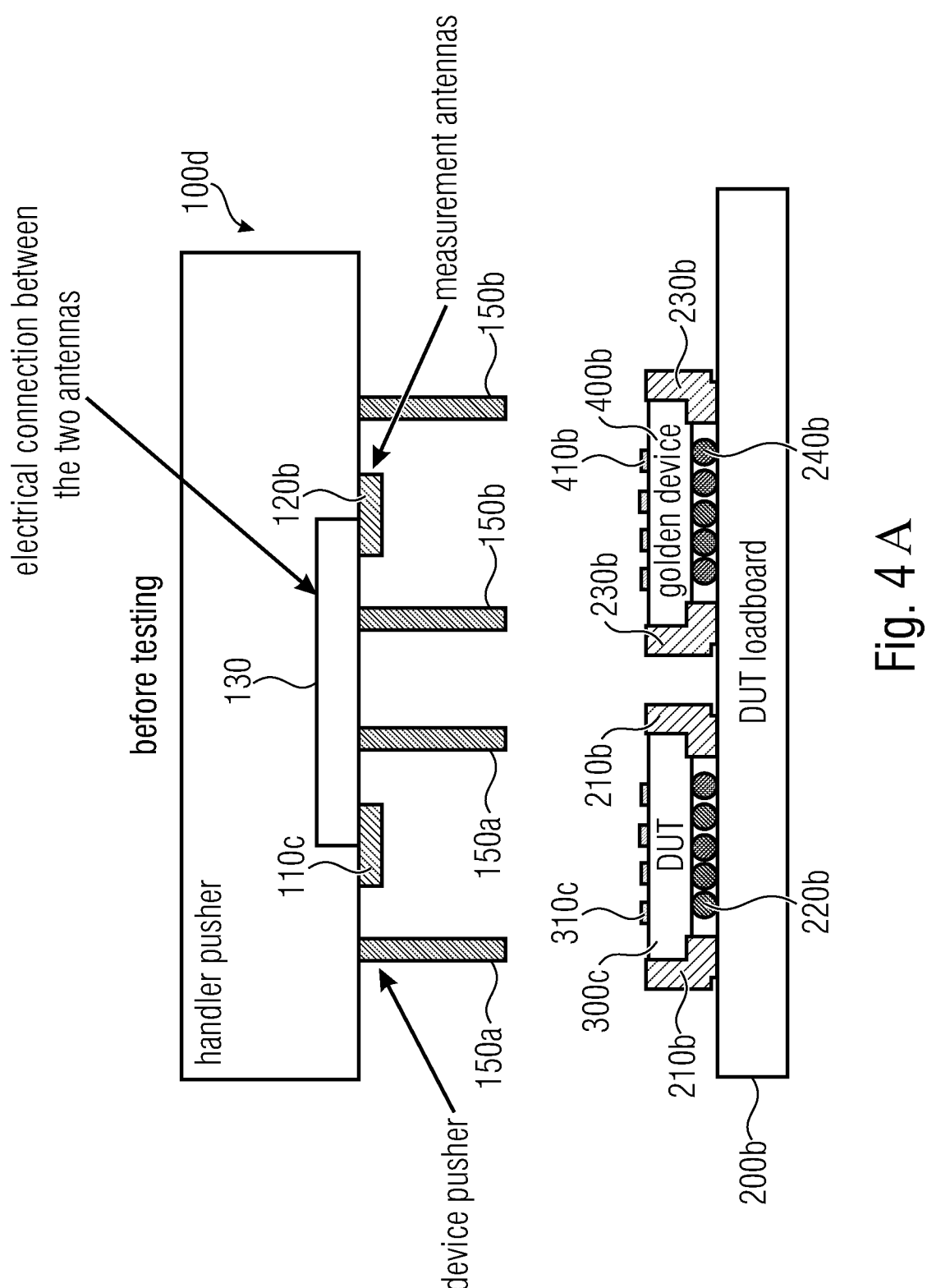
FIGS. 4A and 4B show schematic side views of an ATE component before and during testing, according to embodiments of the disclosure.
Figure 4:
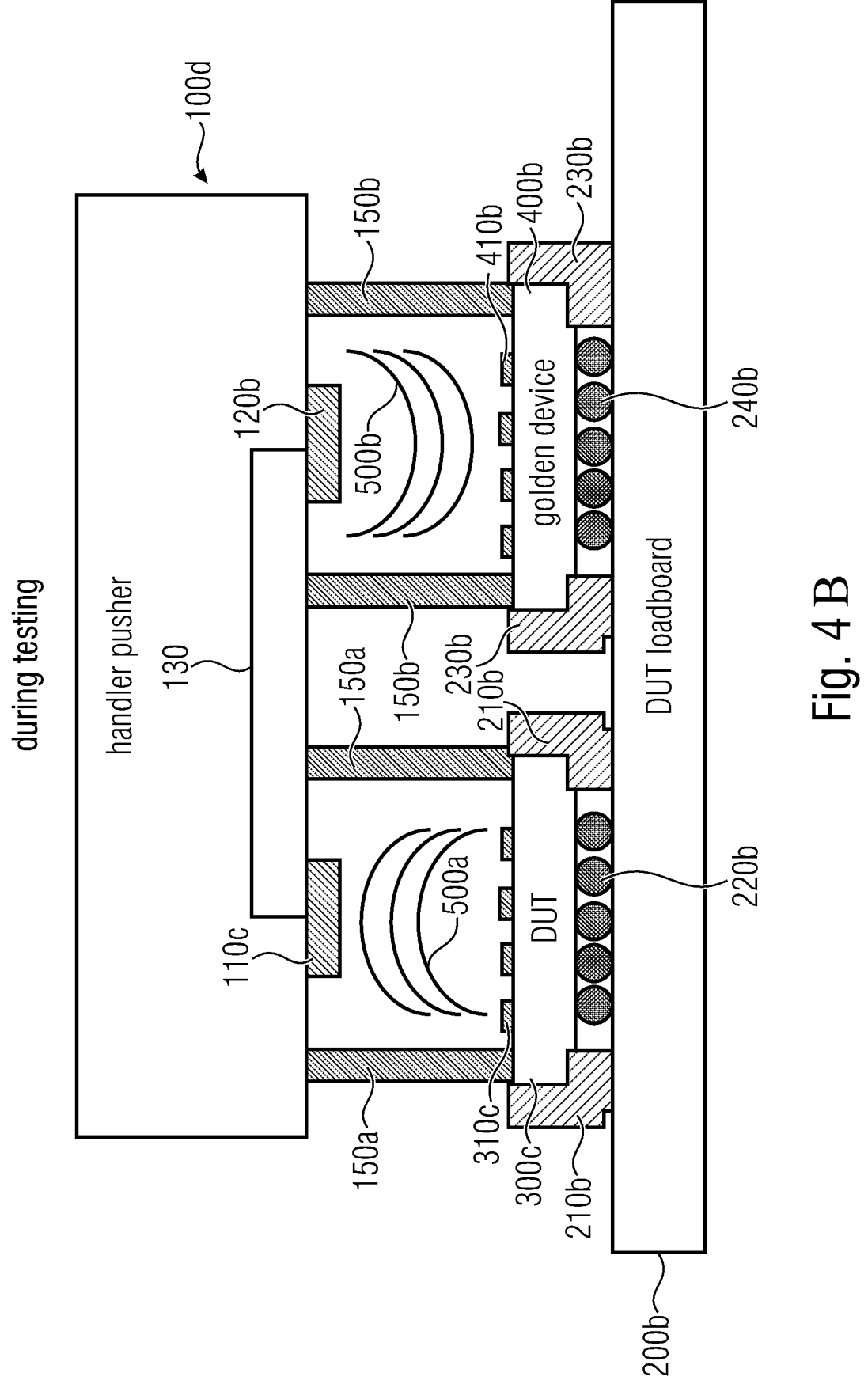

FIGS. 4A and 4B show schematic side views of an ATE component before and during testing, according to embodiments of the disclosure. FIG. 4A shows ATE component 100d, as optionally shown in the form of a handler pusher, comprising a first antenna 110c and a second antenna 120b, e.g., measurement antennas, wherein the first and second antennas are electrically coupled with connection 130 (an electrical connection between the two antennas), e.g., as explained before.

The first antenna 110c may be configured to be coupled wirelessly with a DUT 300c that is arranged on a loadboard 200b and the second antenna 120b may be configured to be coupled wirelessly with a characterizing device 400b, e.g., a golden device, which is arranged on the loadboard 200b as well.

As optional features, loadboard 200b is a DUT loadboard and comprises a DUT position 210b, e.g., a socket on the loadboard, comprising as an optional feature, additionally, electrical coupling elements 220b, e.g., pogo pins or needles for electrically coupling the DUT 300c to the loadboard 200b. As another optional feature, DUT 300c comprises an antenna array 310c for providing and/or receiving a wireless signal.

Accordingly, as optional features, loadboard 200b comprises a characterizing device position 230b, e.g., a socket on the loadboard, comprising as an optional feature, additionally, electrical coupling elements 240b, e.g., pogo pins or needles for electrically coupling the characterizing device 400b to the loadboard 200b. As another optional feature, characterizing device 400b comprises an antenna array 410b for providing and/or receiving a wireless signal.

As another optional feature, ATE component 100d comprises device pushers 150a and 150b. For explanatory purposes a device pusher for each device is shown, however, e.g., in case the characterizing device 400b is soldered to the loadboard, a device pusher for the DUT 300c may be present (or one device pusher for each first antenna, in case the ATE component is configured to be coupled with multiple DUTs in parallel) without a device pusher for the characterizing device 400b.

The device pusher 150a and respectively 150b is configured to push the DUT 310c and the characterizing device 400b, respectively, towards the loadboard 200b. Hence a force may be applied to the DUT 310c and the characterizing device 400b, respectively, in order to enable the electrical coupling elements 220b, 240b to provide an electrical connection between DUT 300c and loadboard 200b and between characterizing device 400b and loadboard 200b, respectively.

A situation during test is shown in FIG. 4B. With force being applied to the DUT 300c, an electrical connection to the loadboard 200b is provided. Hence, loadboard 200b may provide a test signal via electrical coupling elements 220b to the DUT 300c. Based on the test signal, the DUT may provide a wireless signal 500a via antenna array 310c to the first antenna 110c. The ATE component 100d may hence forward the signal to the second antenna 120b (and may optionally manipulate the signal, e.g., using optional circuitry as explained before).

Based thereon, antenna 120b may provide wireless signal 500b (e.g., approximately identical to signal 500a) to the characterizing device 400b which may receive the signal 500b via antenna array 410b, may evaluate the signal and may provide the evaluation result via electrical coupling elements 240b to the loadboard 200b and hence to a testing program.

Figure 5:
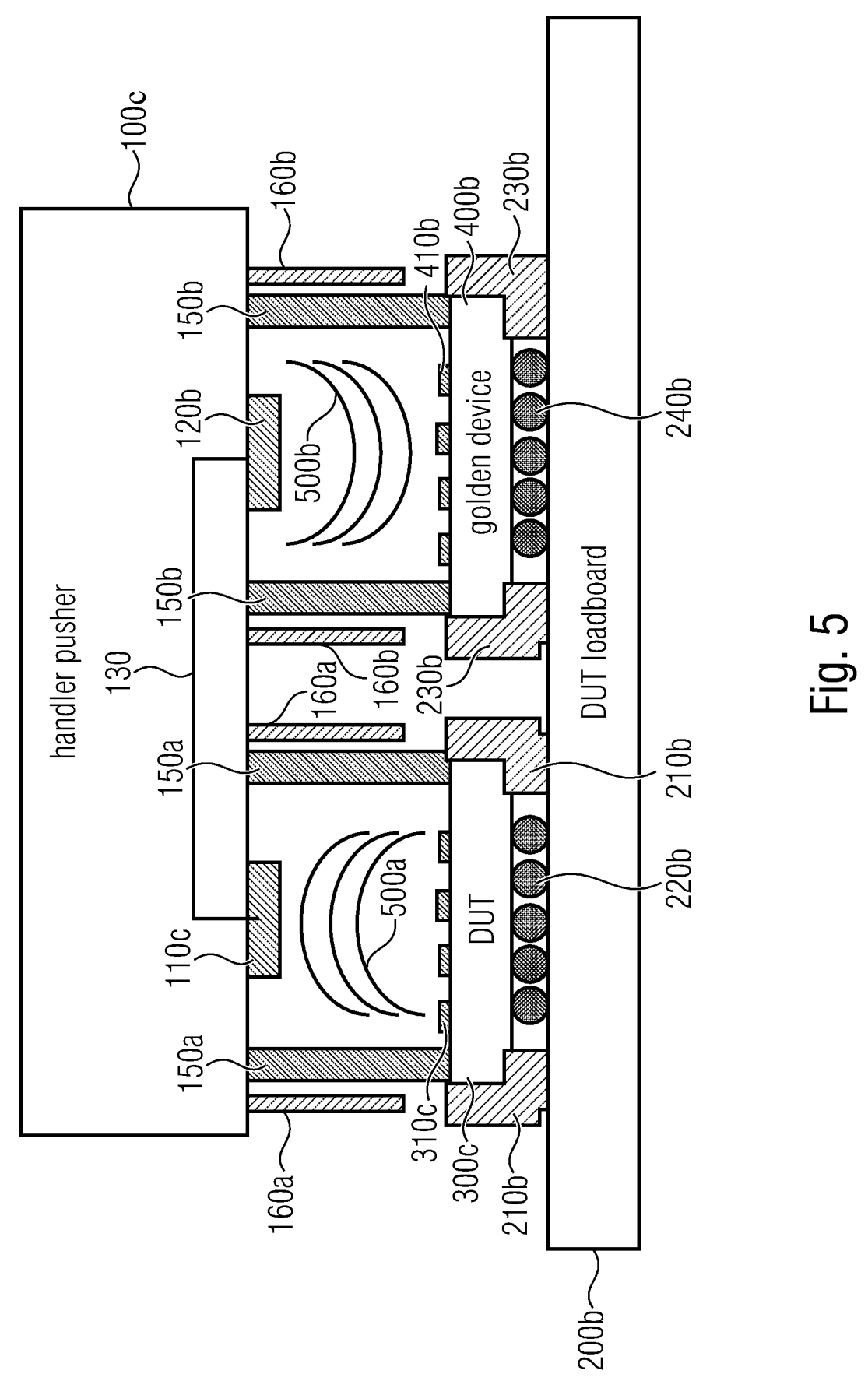
FIG. 5 shows a schematic side view of an ATE component comprising an optional shielding according to embodiments of the disclosure.

FIG. 5 shows a schematic side view of an ATE component comprising an optional shielding according to embodiments of the disclosure. FIG. 5 shows ATE component 100e, comprising, in addition to the elements explained in the context of FIGS. 1 to 4B, shieldings 160*a* and 160*b*. Shielding 160*a* and respectively 160*b* may be configured to reduce electromagnetic disturbances on the signal 500*a* provided by the DUT 300*c* to the characterizing device 400*b*, and/or to reduce electromagnetic disturbances on the signal provided by the characterizing device 400*b* to the DUT 300*c*. Hence, influences of a surrounding or other DUTs on the loadboard may be reduced. This may allow to analyze the behavior of the DUT 300*c* more precisely.

Alternatively or in addition, the shieldings 160*a*, 160*b* may be configured to reduce electromagnetic disturbances in a surrounding of the ATE component caused by the signal 500*a* provided by the DUT 300*c* to the characterizing device (and hence for example caused by signal 500*b* as well), and/or by the signal provided by the characterizing device to the DUT. In other words, the shieldings may as well protect a surrounding of the testing site from influences of the wireless signals, e.g., in order not to alienate or disrupt other tests. This way, robust testing in close proximity to other testing sites may be performed.

As another optional feature, shielding 160*a* and/or 160*b* may be configured to reduce an interference between signals 500*a* and 500*b*. Furthermore, as an example, a respective shielding may be arranged in a sufficient distance from antenna 110*c* and respectively 120*b* in order not to disturb (or disturb with minor impact) a respective antenna characteristics, e.g., as required for testing.

As optionally shown, the shieldings 160*a* and/or 160*b* may be arranged outside a vertical (e.g., perpendicular to a surface of the DUT or characterizing device comprising an antenna array) projection of a respective antenna array 310*c*, 410*b* of a device 300*c*, 400*b* on the ATE component 100*i*, besides a respective antenna 110*c*, 120*b*, e.g., with a predetermined distance to the respective antenna, e.g., not to interfere with characteristics thereof necessary for testing.

It is to be noted that the example shown in FIG. 5 with two shieldings is an optional setup, the ATE component may, for example, comprise one shielding or a plurality of shieldings, e.g., in case the ATE component comprises a plurality of first antennas.

Figures 6A, 6B:
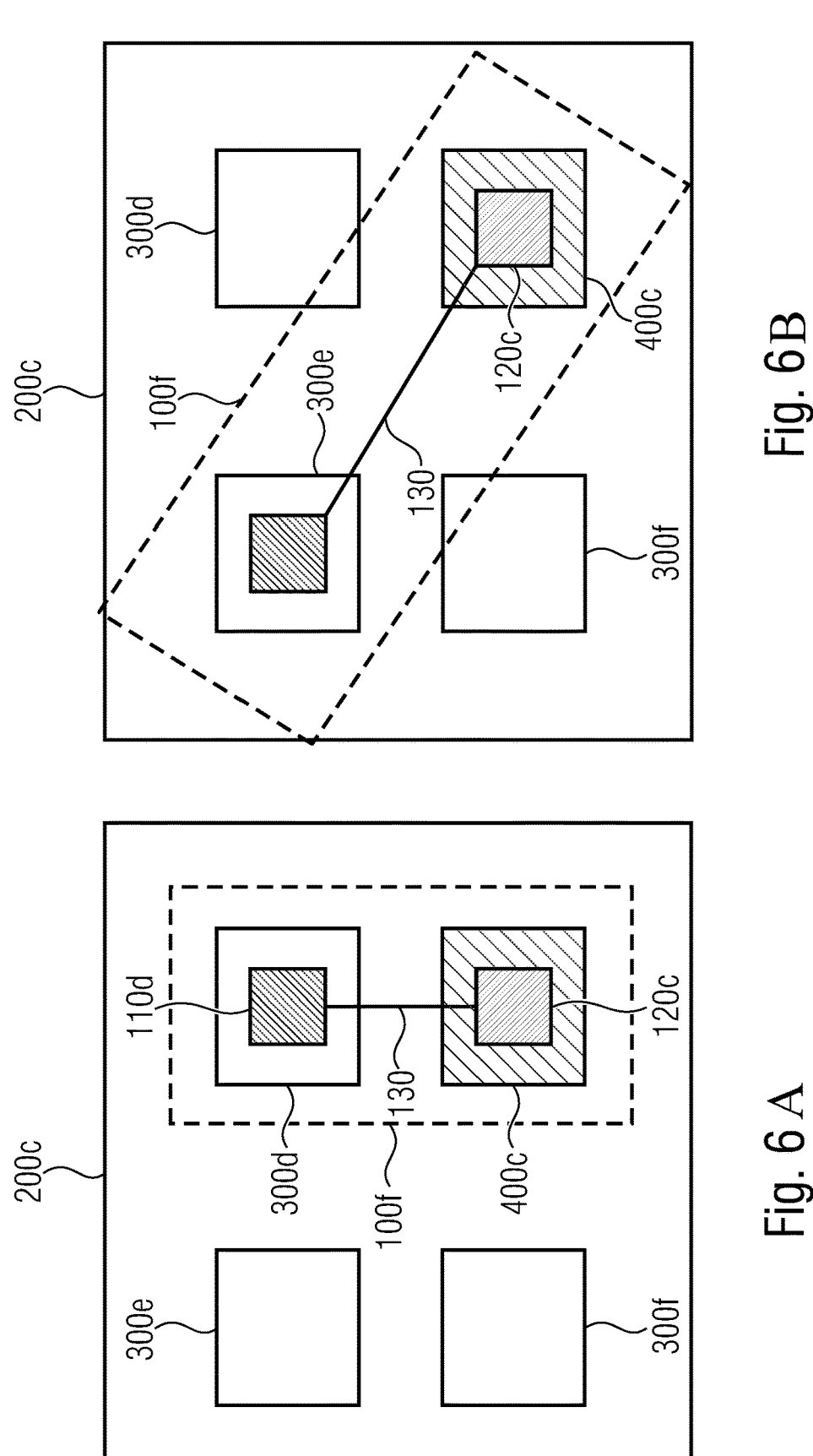
FIGS. 6A, 6B, and 6C show schematic top views of an ATE components and a loadboard with multiple DUTs, according to embodiments of the disclosure.
Figure 6C:
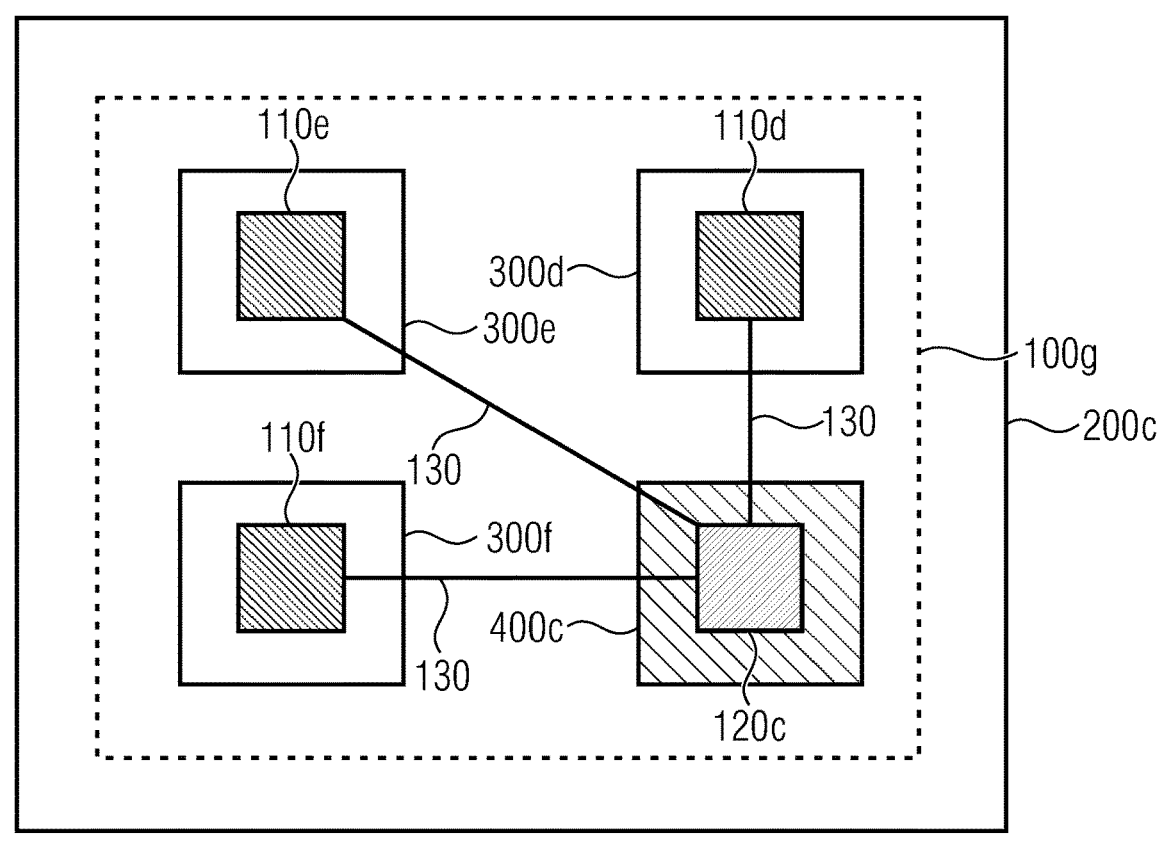

FIGS. 6A, 6B, and 6C show schematic top views of ATE components and a loadboard with multiple DUTs, according to embodiments of the disclosure. FIGS. 6A and 6B show ATE component 100*f* comprising a first antenna 110*d* configured to be coupled wirelessly with a DUT 300*d* and a second antenna 120*c* configured to be coupled with a characterizing device 400*c*.

Underneath the ATE component 100*f* a loadboard 200*c* is shown on which a plurality of DUTs 300*d*, 300*e*, 300*f* are arranged, as well as the characterizing device 400*c*.

ATE component 100*f* may be configured to sequentially couple the characterizing device 400*c* with a plurality of respective DUTs. Hence, as shown in FIG. 6A, ATE component 100*f* may first couple the first antenna 110*d* with the DUT 300*d*, e.g., after testing DUT 300*d*, ATE component 100*f* may decouple antenna 110*d* from DUT 300*d* and couple antenna 110*d* with DUT 300*e* in order to test DUT 300*e* (see FIG. 6B).

It is to be noted that optionally, ATE component 100*f* may be configured to adjust a distance between the first and second antenna. This way, varying distances between DUTs and characterizing device on the loadboard may be compensated.

FIG. 6C shows another ATE component 100*g* above the loadboard 200*c*. As optionally shown in FIG. 6C ATE component 100*g* may be configured to simultaneously, e.g., in parallel, couple the characterizing device 400*c* with a plurality of respective DUTs.

Therefore, the ATE component 100*g* may comprise a plurality of first antennas, namely antennas 110*d*, 110*e*, and 110*f*. Each of the first antennas may be coupled wirelessly with a respective DUT (300*d*, 300*e*, 300*f*). As an example, testing may be performed in parallel as well. Characterizing device 400*c* may provide a signal to antenna 120*c* which may be forwarded to all first antennas and from there to the respective DUT to be processed, e.g., such that a respective processing result is provided via loadboard 200*c* to a test evaluation unit.

Figure 7:
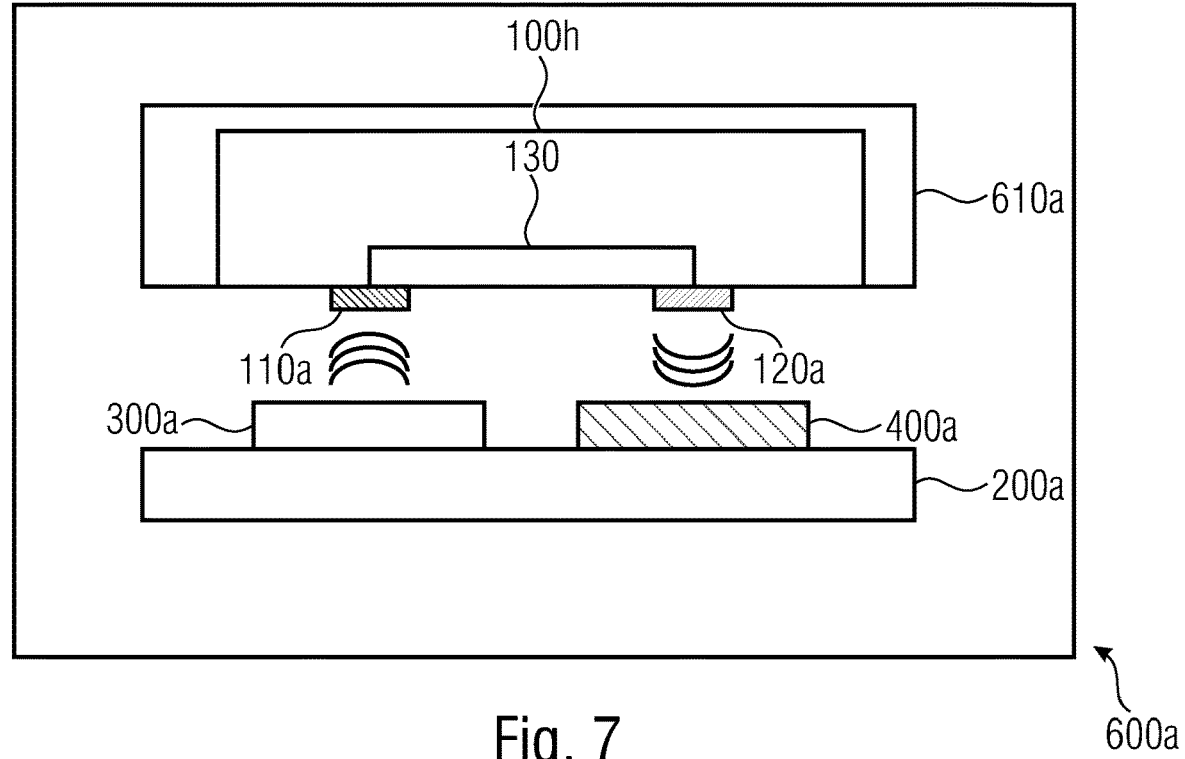
FIG. 7 shows an automated test equipment, ATE, according to embodiments of the disclosure.

FIG. 7 shows an automated test equipment, ATE, according to embodiments of the disclosure. FIG. 7 shows ATE 600*a* comprising a handler 610*a*, the handler comprising an ATE component 100*h*. The ATE component 100*h* may comprise any or all of the features as explained in the context of FIGS. 1 to 6C, individually or taken in combination.

As an example, ATE component 100*h* comprises a first and second antennas 110*a*, 120*a*, coupled via connection 130. Furthermore, ATE 600*a* comprises a loadboard 200*a*. As explained before, antenna 110*a* is configured to establish a wireless connection or coupling with a DUT 300*a*, when the DUT 300*a* is arranged on the loadboard 200*a* and antenna 120*a* is configured to establish a wireless connection or coupling with a characterizing device 400*a*, when the characterizing device 400*a* is arranged on the loadboard 200*a*. In the example shown in FIG. 7 the DUT 300*a* and the characterizing device 400*a* are not part of the ATE 600*a*.

Figure 8A:
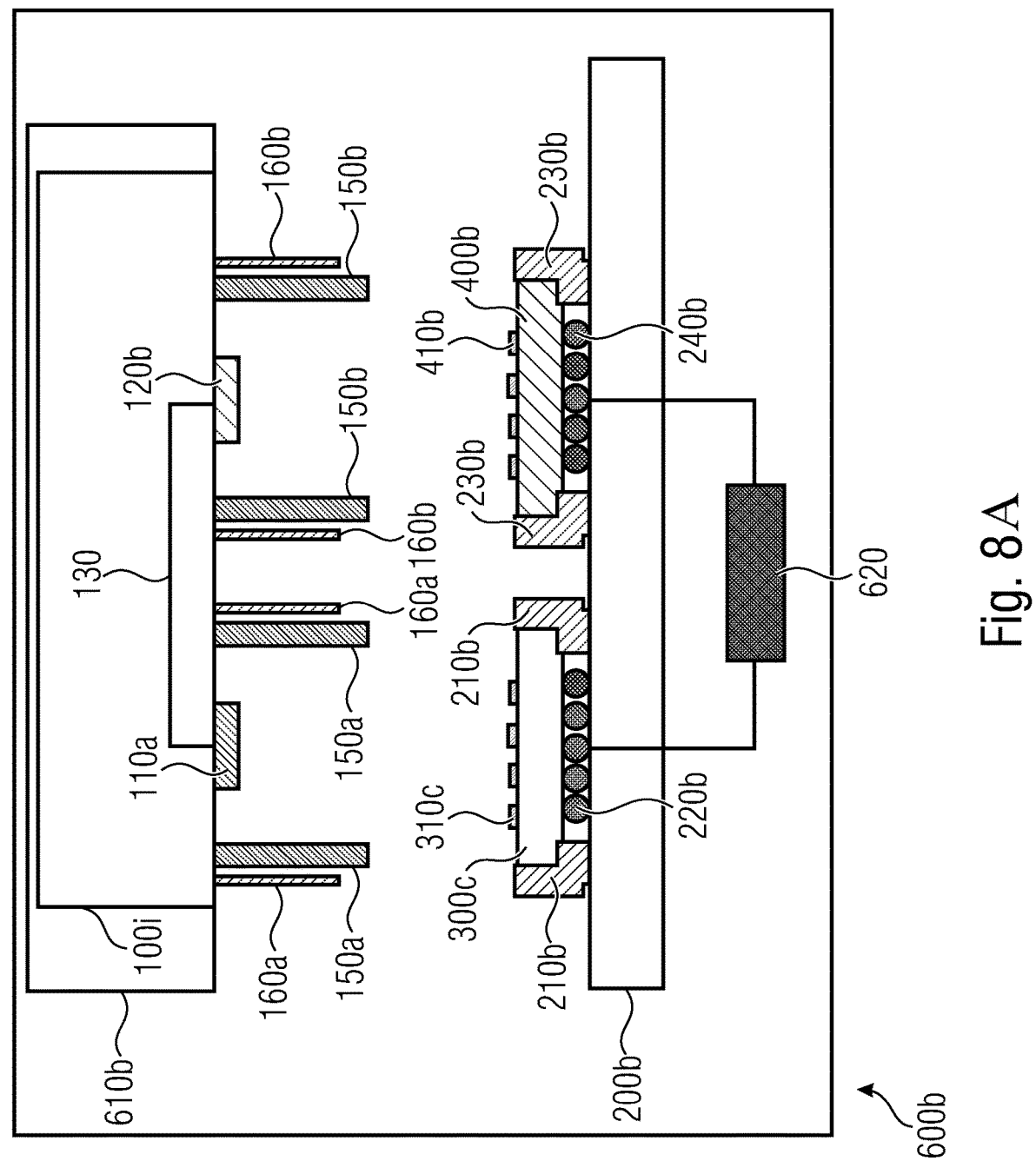
FIGS. 8A and 8B show schematic side views of ATEs with additional, optional features, according to embodiments of the disclosure.
Figure 8:
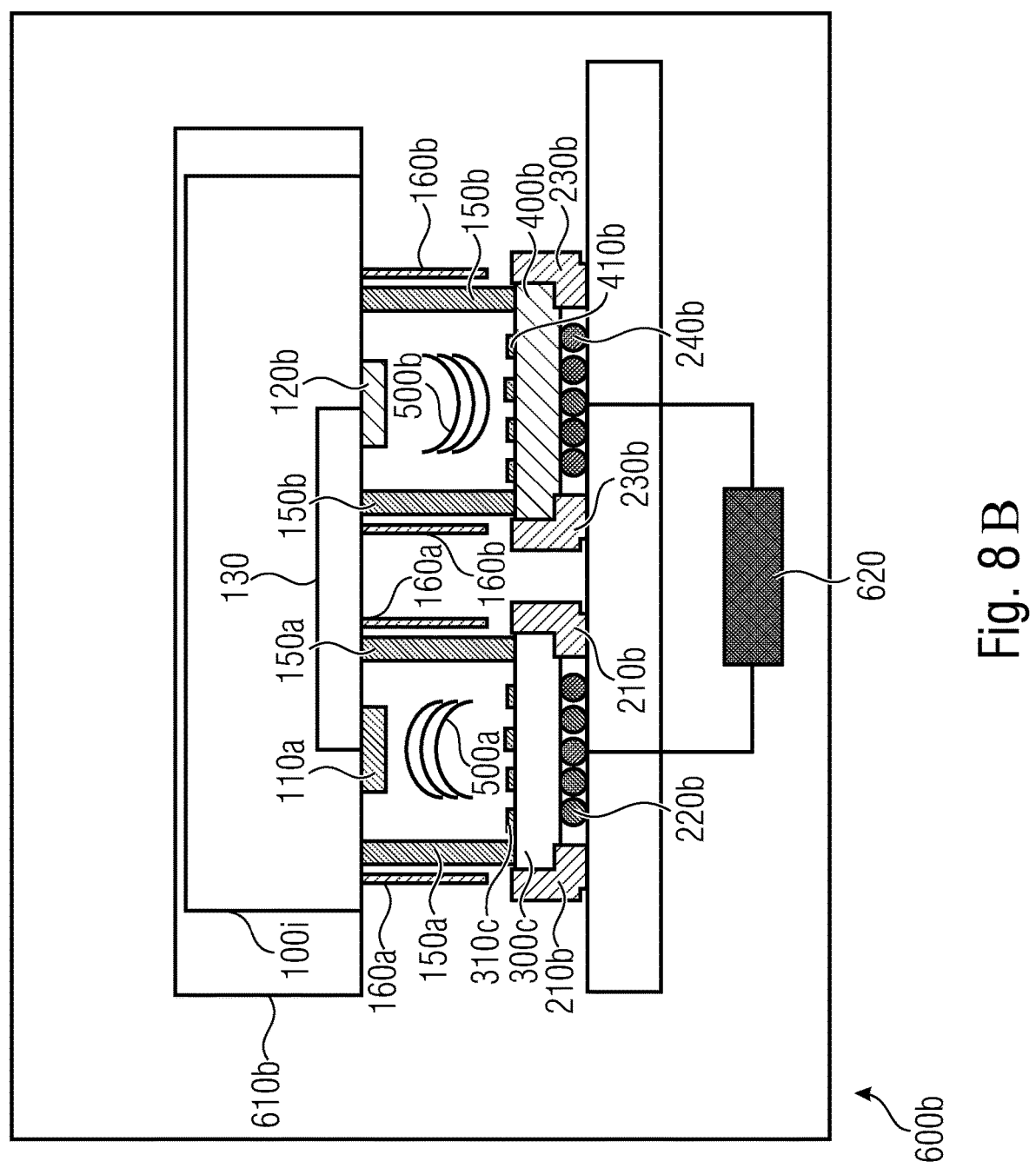

FIGS. 8A and 8B show schematic side views of ATEs with additional, optional features, according to embodiments of the disclosure. FIG. 8A shows ATE 600*b* comprising a handler 610*b*, wherein the handler comprises an ATE component 100*i*. Again, it is to be noted that the ATE component 100*i* may comprise any or all of the features as explained in the context of FIGS. 1 to 7, individually or taken in combination.

As an example, ATE component 100*i* comprises first antenna 110*a*, second antenna 120*a* and connection 130. As further, optional features, ATE component 110*i* comprises device pushers 150*a* and 150*b* as well as shieldings 160*a* and 160*b*.

The ATE 600*b* further comprises a loadboard 200*b* with the features as explained in the context of FIGS. 4A, 4B, and 5. DUT 300*c* comprising antenna array 310*c* and characterizing device 400*b* comprising antenna array 410*b* are arranged on loadboard 220*b*, in order to be coupled with a respective antenna of the ATE component 100*i*.

As another optional feature, ATE 600*b* comprises ATE circuitry 620, configured to configure the DUT 300*c* and the characterizing device 400*b* as corresponding, or, for example, communicating, transmission and receiving devices. It is to be noted that the connections from ATE circuitry 620 to DUT 300*c* and characterizing device 400*b*, respectively, are shown for explanatory purposes, the ATE circuitry may, for example, be electrically coupled to the loadboard 200*b* and hence via electrical coupling elements 220*b* or 240*b* to the respective device (e.g., instead of separate connection lines).

As an example, the ATE 600*b* may start a DUT testing by actuating handler 610*b* to position the first antenna 110*a* vertically above the DUT 300*c* and the second antenna 120*b* vertically above the characterizing device 400*b*. Therefore, as shown in FIGS. 8A and 8B, the loadboard 200*b* may comprise a DUT position 210*b* and a characterizing device position 230*b*, e.g., in the form of sockets. In this area, the electrical coupling elements 220*b* may be arranged in order to allow for a coupling with a respective device with the loadboard 200*b*.

Before providing a test signal to the DUT, the ATE component 100*i* may be in a first distance to the DUT 300*c* and hence the loadboard 200*b*. The ATE 600*b* may be configure to move the handler, such that the ATE component 100*i* is in the first distance to the DUT 300*c* in order to exchange the DUT 300*c*, e.g., after having tested DUT 300*c*, in order to test an untested DUT.

In order to enable testing of the DUT 300*c*, the ATE 600*b* may be configured to set the distance between the ATE component 100*i* and the DUT 300*c*, and, for example, the characterizing device 400*b*, to a second distance, in order to wirelessly couple the first antenna with the DUT 300*c* and to wirelessly couple the second antenna with the characterizing device 400*b*, see FIG. 8B. Therefore, the handler 610*b* may be actuated to move the ATE component 100*i* downwards, towards the loadboard 200*b*.

In this position, the device pushers 150*a* and 150*b* may be configured to apply a pressure or force on the DUT 300*c* and the characterizing device 400*b*, respectively, in order to couple the devices electrically with the loadboard 200*b* via the electrical coupling elements 220*b* and 240*b*, respectively. As explained before, especially characterizing device 400*b* may, for example, be soldered to loadboard 200*b* and may hence not have to be pushed towards the loadboard for a good electrical connection. Hence, pusher 160*b* may not be present according to such embodiments.

For example, in a next step, ATE 600*b* may, for example using ATE circuitry 620, configure DUT 300*c* as transmitting device and characterizing device 400*b* as corresponding receiving device. The ATE may further provide a stimulus to the DUT 300*c* via the loadboard 200*b*, e.g., via electrical coupling elements 220*b*. Based on the stimulus, the DUT may optionally perform a processing procedure and may provide a wireless signal 500*a* (see FIG. 8B).

Shielding 160*a* may protect the signal 500*a* from outside disturbances and may additionally or alternatively protect a surrounding of the DUT 300*c* from the signal 500*a*, e.g., in a sense that other testing sites are not or in a minor way, disturbed by signal 500*a*.

Therefore, as optionally shown in FIGS. 8A and 8B shielding 150*a* may at least partially enclose a volume in a radiation direction of the first antenna. This may allow to provide a substantially electromagnetically shielded transmission path between the DUT 300*c* and the first antenna 110*a*, when the first antenna is coupled wirelessly with the DUT.

The signal received by first antenna 110*a* may then be forwarded to the second antenna 120*b*. Optionally, the signal may be manipulated by additional circuitry, e.g., as explained in the context of FIG. 2. Antenna 120*b* may hence transmit a signal 500*b*, for example, at least approximately equal to signal 500*a* to the characterizing device 400*b*.

Accordingly shielding 160*b* may at least partially enclose a volume in a radiation direction of the second antenna 120*b* and may hence provide a substantially electromagnetically shielded transmission path between the characterizing device 400*b* and the second antenna 120*b*, when the second antenna 120*b* is wirelessly coupled with the characterizing device 400*b*.

The characterizing device 400*b* may receive the signal 500*b* via the antenna array 410*b* and may evaluate the signal in order to provide a test result. As an example, ATE circuitry 620 may process the evaluation result, or may evaluate the signal 500*b* received by the characterizing device 400*b*.

Figure 9:
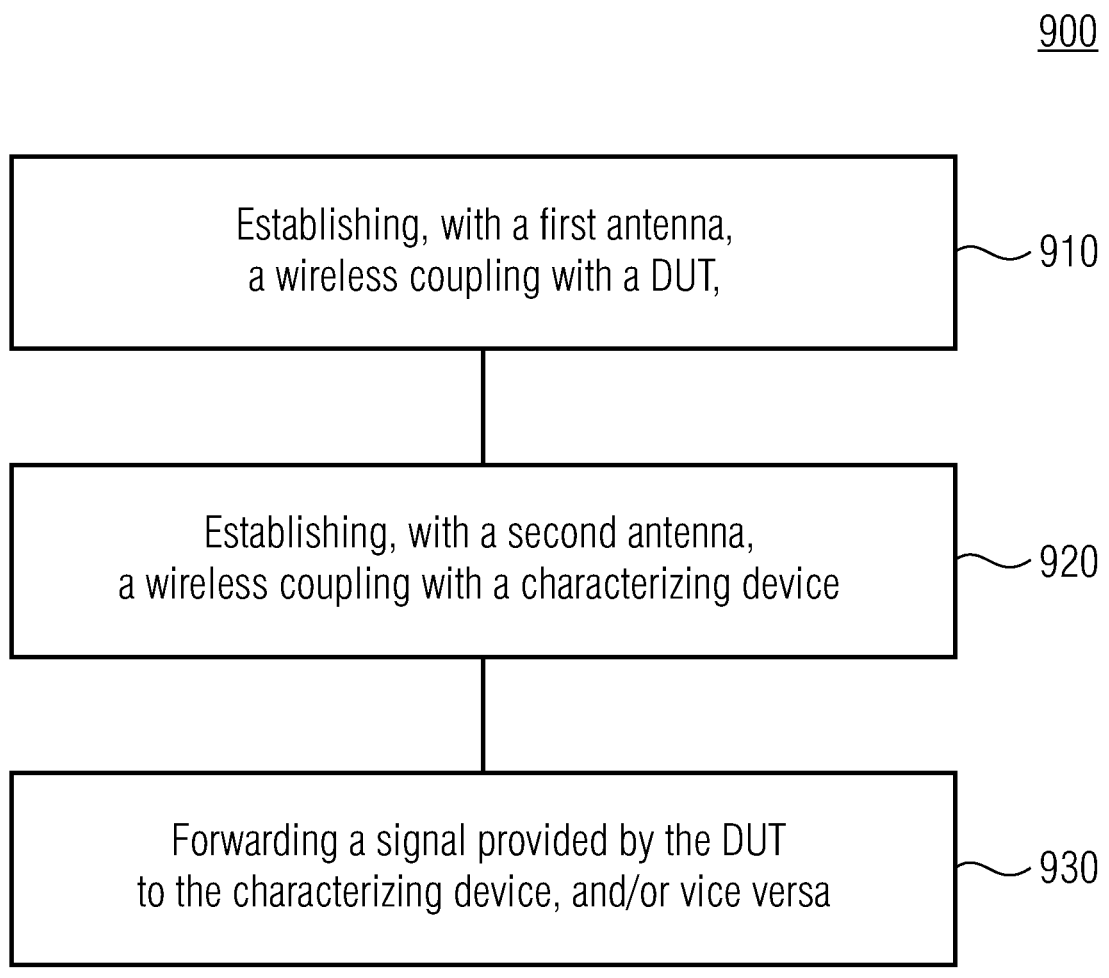
FIG. 9 shows a schematic block diagram of a method for testing a DUT according to embodiments of the disclosure.

FIG. 9 shows a schematic block diagram of a method for testing a DUT according to embodiments of the disclosure. Method 900 comprises establishing 910, with a first antenna, a wireless, e.g., near field, coupling with a DUT, when the DUT is arranged on a loadboard, e.g., a DUT loadboard, and establishing 920, with a second antenna, a wireless, e.g., near field, coupling with a characterizing device, e.g., a golden device, when the characterizing device is arranged, e.g., placed, on the loadboard, wherein the first antenna is electrically coupled with the second antenna. The method 900 further comprises forwarding 930 a signal provided, e.g., transmitted, by the DUT to the characterizing device, and/or vice versa.

Optionally, the wireless, e.g., near field, coupling with the DUT may be established with a first antenna of an ATE component, e.g., as shown in any of FIGS. 1 to 8B. Furthermore, the wireless, e.g., near field, coupling with the characterizing device may be established with the second antenna of the ATE component and the signal may be forwarded using the ATE component.

In general, the characterizing device 400*a* or 400*b* as shown in FIGS. 1 to 8B may be at least one of a calibrated device, e.g., a device being previously tested in a thorough characterization environment, e.g., far field, an uncalibrated device, a device having similar characteristics, e.g., the same characteristics, e.g., comprising an identical device design, e.g., being the same kind of device or being the same device, as the DUT; and/or a device having different characteristics, e.g., being based on a different device design, e.g., comprising a different antenna, relative to the DUT.

Furthermore, it is to be noted that the characterizing device 400*a* or 400*b* as shown in FIGS. 1 to 8B may be soldered to the loadboard and DUT 300*a*, 300*b*, 300*c* may be removably attached to the loadboard, e.g., since a DUT may have to be exchanged more frequently than a characterizing device.

Moreover, the DUT 300*a*, 300*b*, 300*c* may, for example, be an antenna in package device (AiP) device.

In the following, inventive aspects are explained in different words.

Embodiments according to the disclosure comprise an approach for over the air (OTA) testing of an antenna in package (AiP) device in the radiating near field using a golden device.

One main idea according to embodiments (see, e.g., FIGS. 4A and 4B) is to lower the cost of test by not using expensive mmWave instrumentation but avoid some of the drawbacks of the OTA testing using loopback.

When using loopback for OTA testing, e.g., of an antenna in package (AiP) module, we are using the parasitic coupling that there is between the different antenna elements on the AiP module or the non-ideal isolation between polarizations of each AiP antenna element. It is never a good situation to use parasitic effects for testing.

Also, for loopback OTA testing, the DUT may require special DFT that enable transmitting and receiving simultaneously by different antenna elements on the AiP module. This is not a mode that is required for normal operation and requires time and silicon space for implementation, and might also have negative impact on the DUT performance.

The OTA golden device approach does not suffer from the loopback OTA testing drawbacks described above.

The characterizing device, e.g., a golden device, may take space, reducing the maximum number of sites in volume production, but on the other side it may reduce the capital cost of the production test cell, e.g., such that the space reduction, e.g., costs produced by less DUT sites on the loadboard, is more than compensated by the cost savings, e.g., by not having to use expensive mmWave instrumentation.

The characterizing devices, e.g., golden devices, may, for example, be previously tested in a thorough characterization environment (e.g., far field). Also, the characterizing devices, e.g., golden device, could be of a different model or even with a different antenna array, e.g., as long as it works on the same frequency range as the DUT test program.

The measurement antenna used for the DUT, e.g., the first antenna, and the measurement antenna used for the characterizing device, e.g., golden device, e.g., the second antenna, might also have different designs depending on the performance objectives. Also, additional circuitry could be added between the two antennas like attenuators, baluns, combiners, etc.

By doing this setup in the radiating near field, embodiments allow to keep the physical size small, allowing for multi-site integration into a standard test cell.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the disclosure can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the disclosure comprise a data carrier having electronically readable control signals, which are capable of cooperating with a programmable computer system, such that one of the methods described herein is performed.

Generally, embodiments of the present disclosure can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example, via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus and/or software apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the Claims and not by the specific details presented by way of description and explanation of the embodiments herein.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. An automated test equipment (ATE) comprising:
a plurality of antennas operable to support an over the air (OTA) test in a radiating near field region of a device under test (DUT) comprising a DUT antenna component and of a characterizing device (CD) comprising a CD antenna component;
an electrical coupling component operable to electrically couple at least a first antenna of the plurality of antennas to a second antenna of the plurality of antennas, operable to send a first signal wirelessly received by the first antenna to the second antenna to be wirelessly transmitted by the second antenna, and operable to send a second signal wirelessly received by the second antenna to the first antenna to be wirelessly transmitted by the first antenna;
a loadboard operable to receive and to hold the DUT and the CD for the OTA test, wherein the first signal is operable to be wirelessly transmitted by the DUT to the first antenna and to be wirelessly received by the CD from the second antenna, and
wherein the second signal is operable to be wirelessly transmitted by the CD to the second antenna and to be wirelessly received by the DUT from the first antenna; and
an automated test equipment (ATE) component comprising the plurality of antennas and the electrical coupling component, wherein the ATE component is movable to a non-test position in which the OTA test is not performed and in which the ATE component is a first distance from the loadboard and is movable to an OTA test position in which the OTA test is performed in the radiating near field region of the DUT and the CD and in which the ATE component is a second distance from the loadboard.

2. The ATE of claim 1, wherein the loadboard is operable to receive and to hold a second device under test (second DUT) for the OTA test, wherein the second DUT comprises a second DUT antenna component, wherein the electrical coupling component is electrically coupled to a third antenna of the antennas, wherein the third antenna is operable to wirelessly receive a third signal from the second DUT and is operable to wirelessly transmit a signal received via the electrical coupling component to the second DUT, wherein the electrical coupling component comprises selective coupling circuitry operable to selectively couple one of the first antenna or the third antenna to the second antenna for the OTA test.

3. The ATE of claim 1, wherein the electrical coupling component comprises signal modification circuitry operable to modify a signal received from at least one of the antennas before the signal is sent to another one of the antennas.

4. The ATE of claim 3, wherein the signal modification circuitry comprises at least one of an attenuator, a balun, a switch, a diplexer, or a combiner.

5. The ATE of claim 3, wherein modification of the signal performed by the signal modification circuitry is implemented in at least one of a manner for achieving a successful OTA test result of the DUT, a manner for simulating a specific use case for the DUT, a manner for simulating a specific environment for the DUT, or a manner for simulating a plurality of distances between the DUT and the CD.

6. The ATE of claim 1, wherein the second distance is shorter than the first distance, and wherein the DUT is replaced with an untested DUT when the ATE component is in the non-test position.

7. The ATE of claim 6, wherein the ATE component further comprises a plurality of shieldings operable to reduce an electromagnetic interference on wireless signals transmitted by the plurality of antennas and received by the plurality of antennas in the OTA test.

8. The ATE of claim 7, wherein one or more of the device pushers comprise the shieldings.

9. The ATE of claim 1, wherein the antennas are positioned vertically relative to the loadboard, wherein the first antenna is aligned with the DUT when the DUT is positioned on the loadboard, and wherein the second antenna is aligned with the CD when the CD is positioned on the loadboard.

10. The ATE of claim 1, wherein a distance of the second antenna relative to the first antenna is one of fixed or variable.

11. The ATE of claim 1, wherein the CD comprises one of a reference device or an uncalibrated device.

12. The ATE of claim 1, wherein the CD comprises one of a same device as the DUT or a different device relative to the DUT.

13. The ATE of claim 1, wherein the CD antenna component comprises one of a same antenna as the DUT antenna component or a different antenna relative to the DUT antenna component.

14. The ATE of claim 1, wherein the first antenna comprises one of a same antenna as the second antenna or a different antenna relative to the second antenna, and wherein the first antenna and the second antenna are operable to transmit and to receive within a frequency band of the DUT and a frequency band of the CD.

15. The ATE of claim 1, further comprising test circuitry operable to configure one of the DUT or the CD as a transmitting device for the OTA test and operable to configure one of the DUT or the CD as a receiving device for the OTA test, wherein if the DUT is the transmitting device for the OTA test and wirelessly transmits the first signal to the first antenna, the CD is configured to process the first signal wirelessly received from the second antenna to generate a first test result and to communicate to the test circuitry at least one of the first test result or the first signal wirelessly received, and wherein if the CD is the transmitting device for the OTA test and wirelessly transmits the second signal to the second antenna, the DUT is configured to process the second signal wirelessly received from the first antenna to generate a second test result and to communicate to the test circuitry at least one of the second test result or the second signal wirelessly received.

16. The ATE of claim 1, wherein the CD is irremovably attached to the loadboard, and wherein the DUT is removably attached to the loadboard.

17. The ATE of claim 1, wherein the DUT comprises an antenna in package (AiP) device.

18. An automated test equipment (ATE) comprising:
a handler comprising
a plurality of antennas operable to support an over the air (OTA) testing in a radiating near field region of a plurality of devices under test (DUTs) each comprising a DUT antenna component and of a characterizing device (CD) comprising a CD antenna component, and
an electrical coupling component operable to electrically couple a plurality of first antennas of the plurality of antennas to a second antenna of the plurality of antennas, operable to send a respective first signal wirelessly received by a respective first antenna to the second antenna to be wirelessly transmitted by the second antenna, and operable to send a second signal wirelessly received by the second antenna to at least one of the first antennas to be wirelessly transmitted by the at least one of the first antennas, wherein the electrical coupling component comprises
selective coupling circuitry operable to selectively couple a signal path between the second antenna and the at least one of the first antennas for the OTA testing in the radiating near field region; and
a loadboard operable to receive and to hold the DUTs and the CD for the OTA testing in the radiating near field region, wherein the respective first signal is operable to be wirelessly transmitted by a respective DUT to the respective first antenna and to be wirelessly received by the CD from the second antenna, wherein the second signal is operable to be wirelessly transmitted by the CD to the second antenna and to be wirelessly received by each respective DUT from each respective first antenna of the at least one of the first antennas, wherein the handler is movable to a non-test position in which the OTA testing is not performed and in which the handler is a first distance from the loadboard and is movable to an OTA test position in which the OTA testing is performed in the radiating near field region of the DUTs and the CD and in which the handler is a second distance from the loadboard, and wherein the second distance is shorter than the first distance.

19. A method comprising:
establishing a signal path between a device under test (DUT) a DUT antenna component and a characterizing device (CD) comprising a CD antenna component for an over the air (OTA) testing in a radiating near field region of the DUT and of the CD, wherein the signal path is disposed in an automated test equipment (ATE)

and comprises a first antenna vertically positioned relative to the DUT, a second antenna vertically positioned relative to the CD, and an electrical coupling component coupled between the first antenna and the second antenna;

configuring one of the DUT or the CD as a transmitting device;

configuring one of the DUT or the CD as a receiving device;

if the DUT is the transmitting device, wirelessly transmitting a first signal from the DUT to the signal path and wirelessly receiving the first signal by the CD from the signal path;

processing the first signal by the CD to generate a first test result;

if the CD is the transmitting device, wirelessly transmitting a second signal from the CD to the signal path and wirelessly receiving the second signal by the DUT from the signal path; and processing the second signal by the DUT to generate a second test result.

20. The method of claim 19, further comprising:

moving the signal path to position the first antenna vertically relative to a second device under test (second DUT) to create a moved signal path;

configuring one of the second DUT or the CD as the transmitting device;

configuring one of the second DUT or the CD as the receiving device;

if the second DUT is the transmitting device, wirelessly transmitting a third signal from the second DUT to the moved signal path and wirelessly receiving the third signal by the CD from the moved signal path;

processing the third signal by the CD to generate a third test result;

if the CD is the transmitting device, wirelessly transmitting a fourth signal from the CD to the moved signal path and wirelessly receiving the fourth signal by the second DUT from the moved signal path; and processing the fourth signal by the second DUT to generate a fourth test result.

21. The method of claim 19, further comprising:

establishing a plurality of first signal paths among a respective DUT of a plurality of DUTs each comprising the DUT antenna component and the CD for the OTA testing in the radiating near field region of the DUTs and of the CD, wherein the first signal paths are disposed in the ATE and each comprises a respective first antenna vertically positioned relative to a respective DUT, the second antenna vertically positioned relative to the CD, and the respective first antenna selectively enabled to connect to the second antenna.

22. The method of claim 21, further comprising:

a) selectively enabling one of the first signal paths to create an enabled first signal path;

b) configuring one of the respective DUT of the enabled first signal path or the CD as the transmitting device;

c) configuring one of the respective DUT of the enabled first signal path or the CD as the receiving device;

d) if the respective DUT of the enabled first signal path is the transmitting device, wirelessly transmitting a third signal from the respective DUT of the enabled first signal path to the enabled first signal path and wirelessly receiving the third signal by the CD from the enabled first signal path;

e) processing the third signal by the CD to generate a third test result;

f) if the CD is the transmitting device, wirelessly transmitting a fourth signal from the CD to the enabled first signal path and wirelessly receiving the fourth signal by the respective DUT of the enabled first signal path from the enabled first signal path;

g) processing the fourth signal by the respective DUT of the enabled first signal path to generate a fourth test result; and h) repeating steps a) to g) until each of the first signal paths is selectively enabled.

23. The method of claim 19, further comprising:

establishing a plurality of first signal paths among a respective DUT of a plurality of DUTs each comprising the DUT antenna component and the CD for the OTA testing in the radiating near field region of the DUTs and of the CD, wherein the first signal paths are disposed in the ATE and each comprises a respective first antenna vertically positioned relative to a respective DUT, the second antenna vertically positioned relative to the CD, and the respective first antenna electrically coupled to the second antenna;

configuring the CD as the transmitting device;

configuring the respective DUT of each first signal path as the receiving device;

wirelessly transmitting the second signal from the CD to the first signal paths and wirelessly receiving the second signal by the respective DUT from a respective first signal path; and processing the second signal by the respective DUT of the respective first signal path to generate a third test result.

* * * * *